United States Patent
Blanchard

(10) Patent No.: US 7,091,552 B2
(45) Date of Patent: Aug. 15, 2006

(54) HIGH VOLTAGE POWER MOSFET HAVING A VOLTAGE SUSTAINING REGION THAT INCLUDES DOPED COLUMNS FORMED BY TRENCH ETCHING AND ION IMPLANTATION

(75) Inventor: Richard A. Blanchard, Los Altos, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/724,849

(22) Filed: Dec. 1, 2003

(65) Prior Publication Data

US 2004/0110333 A1 Jun. 10, 2004

Related U.S. Application Data

(62) Division of application No. 10/038,845, filed on Dec. 31, 2001, now Pat. No. 6,656,797.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............. 257/329; 257/330; 257/331; 257/339; 257/341; 257/342

(58) Field of Classification Search ........ 257/329, 257/330, 331, 341, 342, 339, 133, 139, 140, 257/146, 147, 162; 438/133, 350, 135, 268, 438/141, 138, 200

See application file for complete search history.

(56) References Cited

U.S. PATENT DOCUMENTS 4,419,150 A 12/1983 Soclof .................. 148/187
4,569,701 A 2/1986 Oh ....................... 148/188

(Continued)

OTHER PUBLICATIONS

Chen, Xing Bi et al., "A Novel High-Voltage Sustaining Structure With Buried Oppositely Doped Regions," *IEEE Transactions on Electron Devices*, vol. 47, No. 6, Jun. 2000, pp. 1280-1285.

(Continued)

*Primary Examiner*—Steven Loke
(74) *Attorney, Agent, or Firm*—Mayer & Williams PC; Stuart H. Mayer, Esq.; Karin L. Williams, Esq.

(57) ABSTRACT

A power semiconductor device is made in accordance with a method of providing a substrate of a first or second conductivity type and then forming a voltage sustaining region on the substrate. The voltage sustaining region is formed by depositing an epitaxial layer of a first conductivity type on the substrate and forming at least one trench in the epitaxial layer. A barrier material is deposited along the walls of the trench. A dopant of a second conductivity type is implanted through the barrier material into a portion of the epitaxial layer adjacent to and beneath the bottom of the trench. The dopant is diffused to form a first doped layer in the epitaxial layer and the barrier material is removed from at least the bottom of the trench. The trench is etched through the first doped layer. A second doped layer is formed in the same manner as the first doped layer. The second doped layer is located vertically below the first doped layer. A filler material is deposited in the trench to substantially fill the trench. The dopant in the First and second doped layers are diffused to cause the first and second doped layers to overlap one another, thus completing the voltage sustaining region. Finally, at least one region of the second conductivity type is formed over the voltage sustaining region to define a junction therebetween.

13 Claims, 7 Drawing Sheets

U.S. PATENT DOCUMENTS

| | | | |
|---|---|---|---|
| 4,711,017 A | 12/1987 | Lammert | 437/20 |
| 4,893,160 A | 1/1990 | Blanchard | 357/23.4 |
| 5,108,783 A | 4/1992 | Tanigawa et al. | 437/63 |
| 5,216,275 A | 6/1993 | Chen | 257/493 |
| 6,465,304 B1 | 10/2002 | Blanchard et al. | 438/268 |
| 6,566,201 B1 | 5/2003 | Blanchard | 438/268 |
| 6,576,516 B1 | 6/2003 | Blanchard | 438/268 |
| 6,649,477 B1 | 11/2003 | Blanchard et al. | 438/268 |
| 2001/0026977 A1 | 10/2001 | Hattori et al. | 438/268 |
| 2001/0036704 A1 | 11/2001 | Hueting et al. | 438/270 |
| 2001/0053568 A1 | 12/2001 | Deboy et al. | 438/138 |
| 2002/0117715 A1 | 8/2002 | Oppermann et al. | 257/339 |
| 2003/0122189 A1 | 7/2003 | Blanchard et al. | 438/268 |

OTHER PUBLICATIONS

Cezac, N. et al., "A New Generation of Power Unipolar Devices: the Concept of the Floating Islands MOS Transistor (FLIMOST)," *Proceedings of the 12th International Symposium on Power Semiconductor Devices & ICs*, Toulouse, France, May 22-25, 2000, pp. 69-72.

Deboy, G. et al, "A New Generation of High Voltage MOSFETs Breaks the Limit Line of Silicon," *International Electron Devices Meeting Technical Digest*, Dec. 6-9, 1998, pp. 683-685.

Lee, Ming-Kwang et al., "On the Semi-Insulating Polycrystalline Silicon Resistor," *Solid State Electronics*, vol. 27, No. 11, 1984, pp. 995-1001.

CONVENTIONAL MOSFET

THE DOPANT DISTRIBUTION OF A HIGH VOLTAGE VERTICAL
DMOS TRANSISTOR WITH A RELATIVELY LOW ON-RESISTANCE

1. EPITAXIAL DEPOSITION
2. FORMATION OF THE TRENCH ETCH STOP LAYER
3. MASK AND ETCH THE TRENCH ETCH STOP LAYER
4. TRENCH ETCH

5. GROW THIN OXIDE LAYER IN THE TRENCH
6. IMPLANT THE DOPANT

7. PERFORM A HIGH TEMPERATURE DIFFUSION
8. ETCH THE OXIDE AT THE BOTTOM OF THE TRENCH

9. REPEAT THE DOPING AND ETCH STEPS AS MANY TIMES AS REQUIRED
10. DOPE THE REGION FURTHEST FROM THE SURFACE

11. FILL THE TRENCH
12. PLANARIZE THE WAFER SURFACE

13. PERFORM A HIGH TEMPERATURE DIFFUSION STEP

HIGH VOLTAGE POWER MOSFET HAVING A VOLTAGE SUSTAINING REGION THAT INCLUDES DOPED COLUMNS FORMED BY TRENCH ETCHING AND ION IMPLANTATION

RELATED APPLICATIONS

This application is a division of U.S. patent application Ser. No. 10/038,845, filed Dec. 31, 2001, now U.S. Pat. No. 6,656,797, entitled "High Voltage Power MOSFET Having A Voltage Sustaining Region That Includes Doped Columns Formed By Trench Etching And Ion Implantation."

This application is related to copending U.S. patent application Ser. No. 09/970,972 entitled "Method for Fabricating a Power Semiconductor Device Having a Floating Island Voltage Sustaining Layer," filed in the United States Patent and Trademark Office on Oct. 4, 2001.

This application is related to copending U.S. patent application Ser. No. 10/039,068 entitled "Method For Fabricating A High Voltage Power MOSFET Having A Voltage Sustaining Region That Includes Doped Columns Formed By Rapid Diffusion," filed in the United States Patent and Trademark Office on Dec. 31, 2001.

FIELD OF THE INVENTION

The present invention relates generally to semiconductor devices, and more particularly to power MOSFET devices.

BACKGROUND OF THE INVENTION

Power MOSFET devices are employed in applications such as automobile electrical systems, power supplies, and power management applications. Such devices should sustain high voltage in the off-state while having a low voltage drop and high current flow in the on-state.

FIG. 1 illustrates a typical structure for an N-channel power MOSFET. An N-epitaxial silicon layer 1 formed over an N+ silicon substrate 2 contains p-body regions 5a and 6a, and N+ source regions 7 and 8 for two MOSFET cells in the device. P-body regions 5 and 6 may also include deep p-body regions 5b and 6b. A source-body electrode 12 extends across certain surface portions of epitaxial layer 1 to contact the source and body regions. The N-type drain for both cells is formed by the portion of N-epitaxial layer 1 extending to the upper semiconductor surface in FIG. 1. A drain electrode is provided at the bottom of N+ substrate 2. An insulated gate electrode 18 typically of polysilicon lies primarily over the body and portions of the drain of the device, separated from the body and drain by a thin layer of dielectric, often silicon dioxide. A channel is formed between the source and drain at the surface of the body region when the appropriate positive voltage is applied to the gate with respect to the source and body electrode.

The on-resistance of the conventional MOSFET shown in FIG. 1 is determined largely by the drift zone resistance in epitaxial layer 1. The drift zone resistance is in turn determined by the doping and the layer thickness of epitaxial layer 1. However, to increase the breakdown voltage of the device, the doping concentration of epitaxial layer 1 must be reduced while the layer thickness is increased. Curve 20 in FIG. 2 shows the on-resistance per unit area as a function of the breakdown voltage for a conventional MOSFET. Unfortunately, as curve 20 shows, the on-resistance of the device increases rapidly as its breakdown voltage increases. This rapid increase in resistance presents a problem when the MOSFET is to be operated at higher voltages, particularly at voltages greater than a few hundred volts.

FIG. 3 shows a MOSFET that is designed to operate at higher voltages with a reduced on-resistance. This MOSFET is disclosed in paper No. 26.2 in the Proceedings of the IEDM, 1998, p. 683. This MOSFET is similar to the conventional MOSFET shown in FIG. 1 except that it includes p-type doped regions 40 and 42 which extend from beneath the body regions 5 and 6 into the drift region of the device. The p-type doped regions 40 and 42 define columns in the drift region that are separated by n-type doped columns, which are defined by the portions of the epitaxial layer 1 adjacent the p-doped regions 40 and 42. The alternating columns of opposite doping type cause the reverse voltage to be built up not only in the vertical direction, as in a conventional MOSFET, but in the horizontal direction as well. As a result, this device can achieve the same reverse voltage as in the conventional device with a reduced layer thickness of epitaxial layer 1 and with increased doping concentration in the drift zone. Curve 25 in FIG. 2 shows the on-resistance per unit area as a function of the breakdown voltage of the MOSFET shown in FIG. 3. Clearly, at higher operating voltages, the on-resistance of this device is substantially reduced relative to the device shown in FIG. 1, essentially increasing linearly with the breakdown voltage.

The improved operating characteristics of the device shown in FIG. 3 are based on charge compensation in the drift region of the transistor. That is, the doping in the drift region is substantially increased, e.g., by an order of magnitude or more, and the additional charge is counterbalanced by the addition of columns of opposite doping type. The blocking voltage of the transistor thus remains unaltered. The charge compensating columns do not contribute to the current conduction when the device is in its on state. These desirable properties of the transistor depend critically on the degree of charge compensation that is achieved between adjacent columns of opposite doping type. Unfortunately, nonuniformities in the dopant gradient of the columns can be difficult to avoid as a result of limitations in the control of process parameters during their fabrication. For example, diffusion across the interface between the columns and the substrate and the interface between the columns and the p-body region will give rise to changes in the dopant concentration of the portions of the columns near those interfaces.

The structure shown in FIG. 3 can be fabricated with a process sequence that includes multiple epitaxial deposition steps, each followed by the introduction of the appropriate dopant. Unfortunately, epitaxial deposition steps are expensive to perform and thus this structure is expensive to manufacture. Another technique for fabricating these devices is shown in copending U.S. application Ser. No. 09/970,972, in which a trench is successively etched to different depths. A dopant material is implanted and diffused through the bottom of the trench after each etching step to form a series of doped regions (so-called "floating islands") that collectively function like the p-type doped regions 40 and 42 seen in FIG. 3. However, the on-resistance of a device that uses the floating island technique is not as low as an identical device that uses continuous columns.

Accordingly, it would be desirable to provide a method of fabricating the MOSFET structure shown in FIG. 3 that requires a minimum number of epitaxial deposition steps so that it can be produced less expensively while also allowing sufficient control of process parameters so that a high degree of charge compensation can be achieved in adjacent columns of opposite doping type in the drift region of the device.

SUMMARY OF THE INVENTION

In accordance with the present invention, a method is provided for forming a power semiconductor device. The method begins by providing a substrate of a first conductivity type and then forming a voltage sustaining region on the substrate. The voltage sustaining region is formed by depositing an epitaxial layer of a first conductivity type on the substrate and forming at least one trench in the epitaxial layer. A barrier material is deposited along the walls of the trench. A dopant of a second conductivity type is implanted through the barrier material into a portion of the epitaxial layer adjacent to and beneath the bottom of the trench. The dopant is diffused to form a first doped layer in the epitaxial layer and the barrier material is removed from at least the bottom of the trench. The trench is etched through the first doped layer. A second doped layer is formed in the same manner as the first doped layer. The second doped layer is located vertically below the first doped layer. A filler material is deposited in the trench to substantially fill the trench. The dopant in the first and second doped layers are diffused to cause the first and second doped layers to overlap one another, thus completing the voltage sustaining region. Finally, at least one region of the second conductivity type is formed over the voltage sustaining region to define a junction therebetween.

The power semiconductor device formed by the inventive method may be selected from the group consisting of a vertical DMOS, V-groove DMOS, and a trench DMOS MOSFET, an IGBT, a bipolar transistor, and a diode.

In accordance with another aspect of the invention, a power semiconductor device is provided. The device includes a substrate of a first conductivity type and a voltage sustaining region disposed on the substrate. The voltage sustaining region includes an epitaxial layer having a first conductivity type and at least one trench located in the epitaxial layer. At least one doped column having a dopant of a second conductivity type is located in the epitaxial layer, adjacent a sidewall of the trench. The column is formed from a plurality of doped layers that are arranged vertically one over the other and which are diffused into one another. A filler material is also provided, which substantially fills the trench. At least one region of the second conductivity is disposed over the voltage sustaining region to define a junction therebetween.

DETAILED DESCRIPTION

In accordance with the present invention, a method of forming the p-type columns in the voltage sustaining layer of a semiconductor power device may be generally described as follows. First, one or more trenches are etched in the epitaxial layer that is to form the voltage sustaining region of the device. Each trench is centered where a doped column is to be located. A first doped section of the column is formed by implanting p-type dopant material into the bottom of the trench. The implanted material is diffused into the portion of the voltage sustaining region located immediately adjacent to and below the trench bottom. The trenches are subsequently etched to a greater depth so that a second doped section of the column is formed by again implanting and diffusing a p-type dopant material. The aforementioned process is repeated until the desired number of vertically arranged segments of each column have been formed. The trenches are filled with a material that does not adversely affect the characteristics of the device. Exemplary materials that may be used for the material filling the trenches include highly resistive polysilicon, a dielectric such as silicon dioxide, or other materials and combinations of materials. Finally, a thermal diffusion step is performed to cause adjacent doped section to overlap one another, thus forming a continous doped column of the type depicted in FIG. 3.

Figure 1:
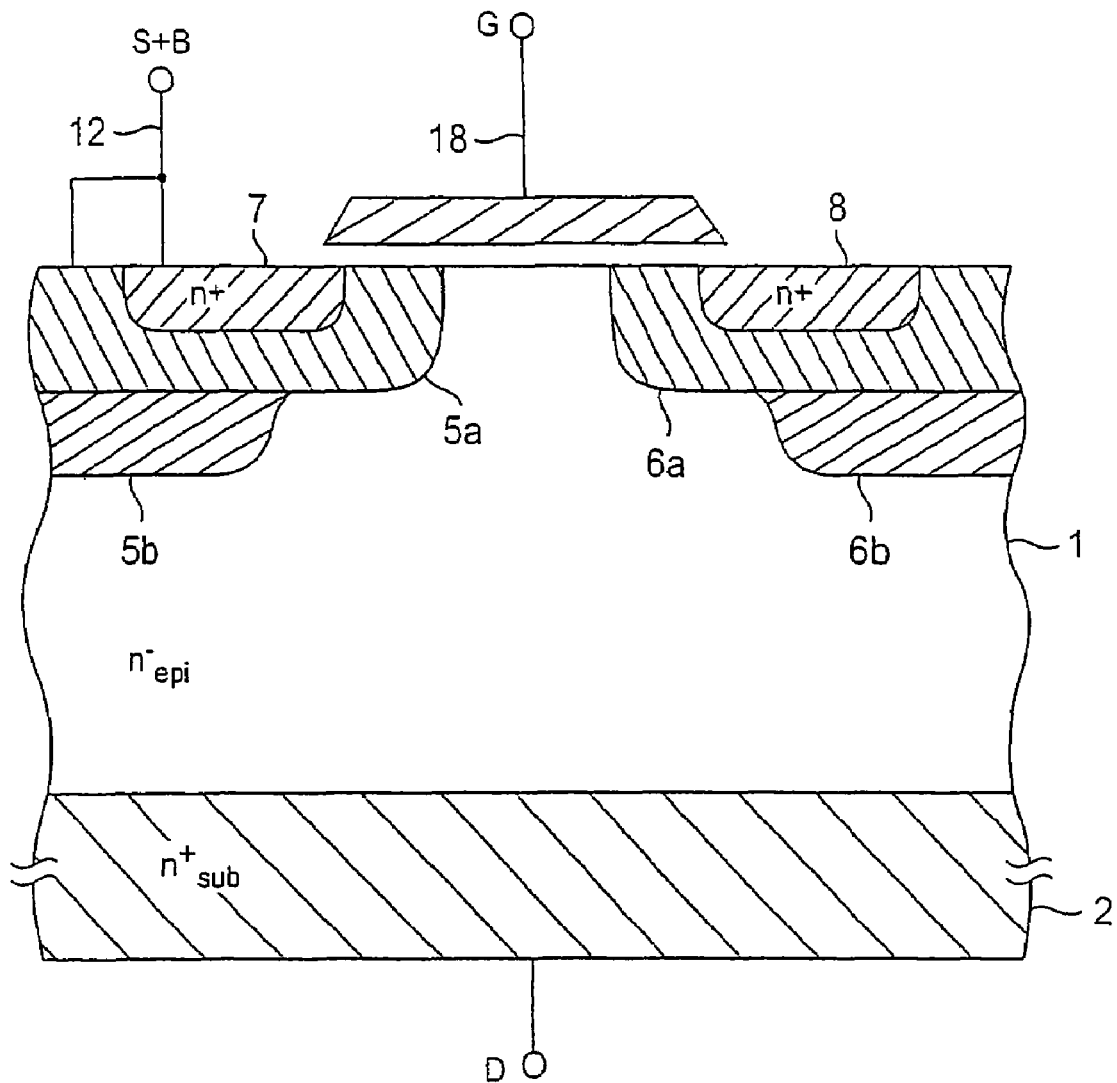
FIG. 1 shows a cross-sectional view of a conventional power MOSFET structure.
Figure 2:
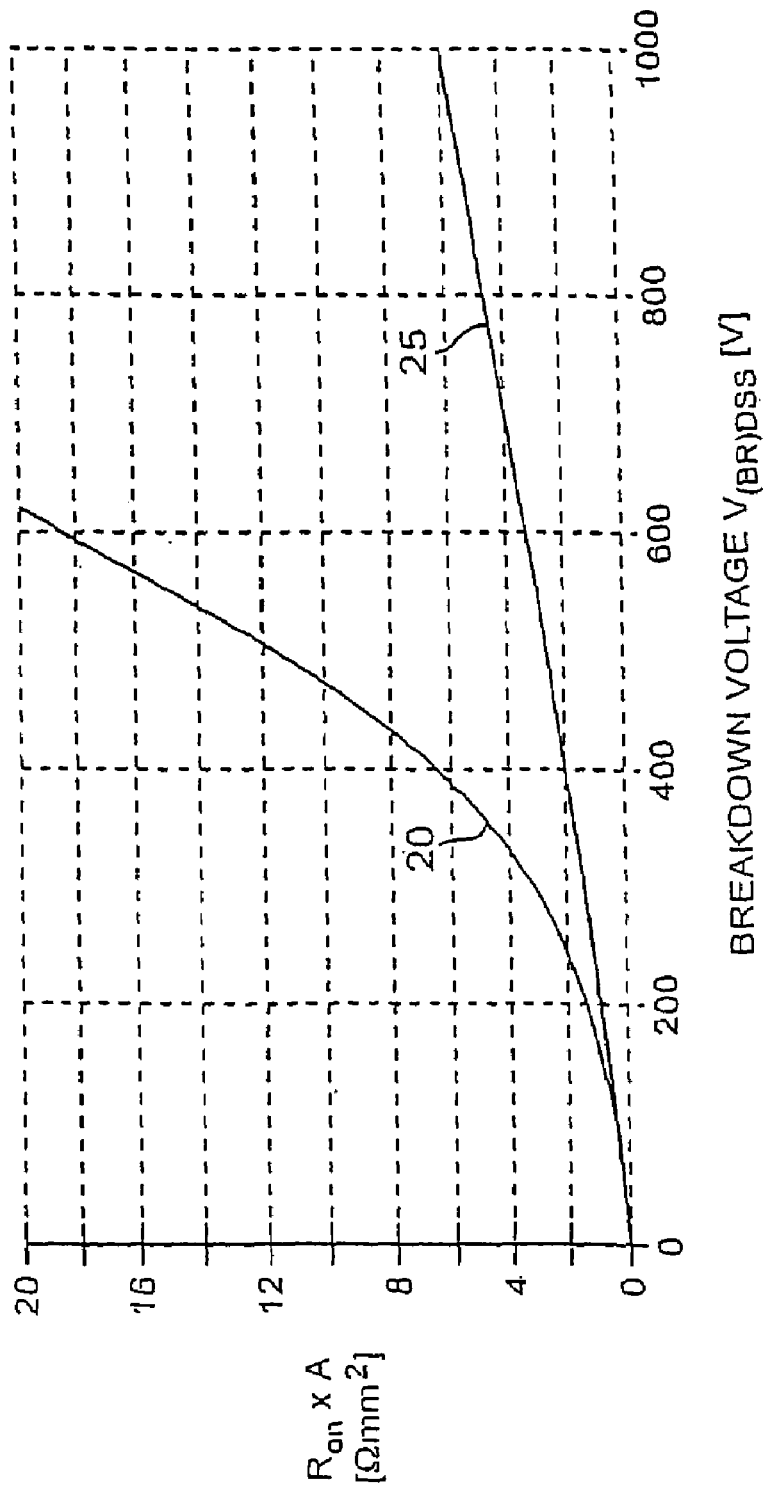
FIG. 2 shows the on-resistance per unit area as a function of the breakdown voltage for a conventional power MOSFET.
Figure 3:
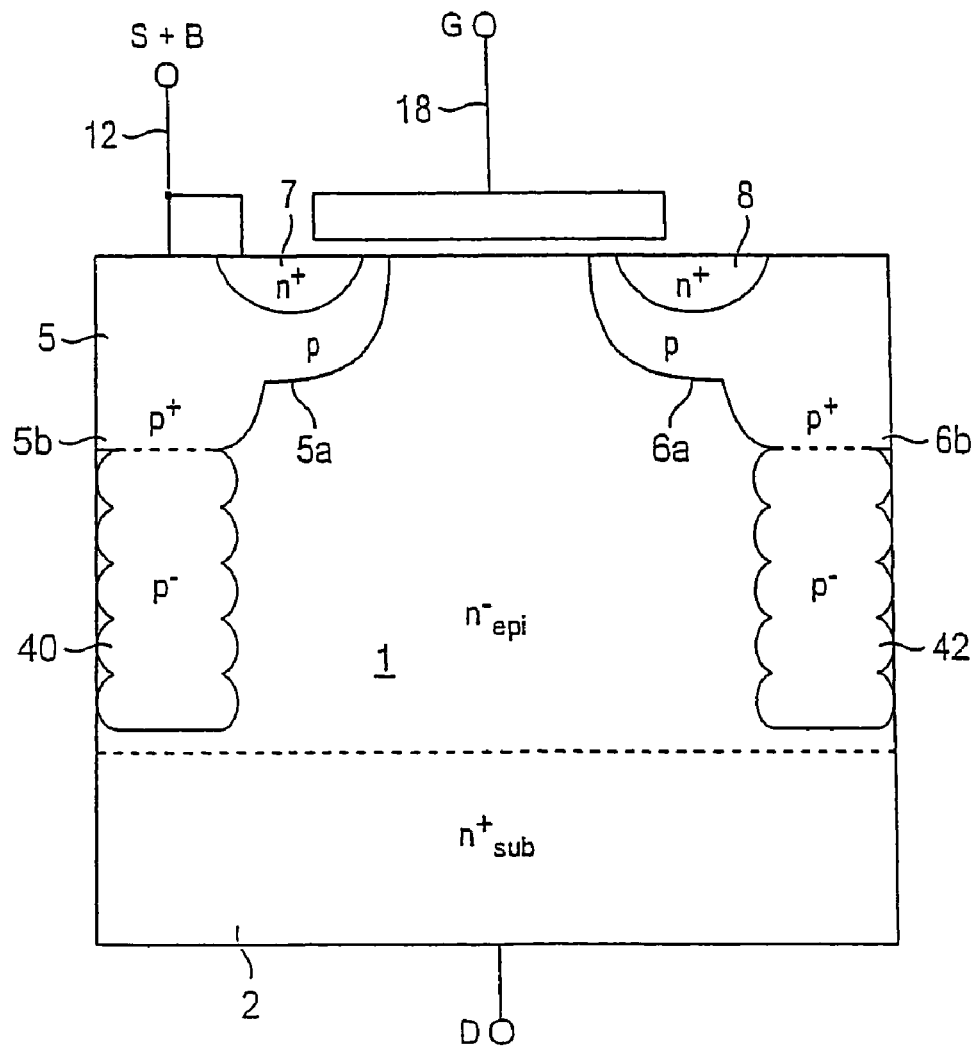
FIG. 3 shows a MOSFET structure that includes a voltage sustaining region with columns of p-type dopant located below the body region, which is designed to operate with a lower on-resistance per unit area at the same voltage than the structure depicted in FIG. 1.

The power semiconductor device shown in FIG. 3 may be fabricated in accordance with the following exemplary steps, which are illustrated in FIGS. 4(a)–4(f).

First, the N-type doped epitaxial layer 501 is grown on a conventionally N+ doped substrate 502. Epitaxial layer 501 is typically 15–50 microns in thickness for a 400–800 V device with a resistivity of 5–40 ohm-cm. Next, a dielectric masking layer is formed by covering the surface of epitaxial layer 501 with a dielectric layer, which is then conventionally exposed and patterned to leave a mask portion that defines the location of the trench 520. The trench 520 is dry etched through the mask openings by reactive ion etching to an initial depth that may range, for example, from 5–15 microns. In general, the trench depth should be selected so that after the final diffusion step is performed at the end of the fabrication process the different doped sections will overlap adjacent doped sections. In general, the trench depths, dopant dose and the magnitude and duration of the diffusion process should be selected to achieve the desired charge compensation.

The sidewalls of each trench may be smoothed, if needed. First, a dry chemical etch may be used to remove a thin layer of oxide (typically about 500–1000 A) from the trench sidewalls to eliminate damage caused by the reactive ion etching process. Next, a sacrificial silicon dioxide layer is grown over the trench 520. The sacrificial layer is removed either by a buffer oxide etch or an HF etch so that the resulting trench sidewalls are as smooth as possible.

Figure 4A:
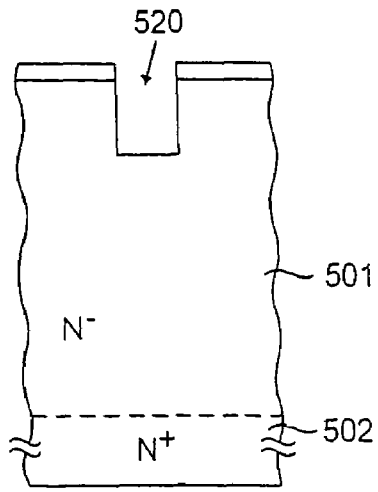
FIGS. 4(a)–4(f) show a sequence of exemplary process steps that may be employed to fabricate a voltage sustaining region constructed in accordance with the present invention.
Figure 4B:
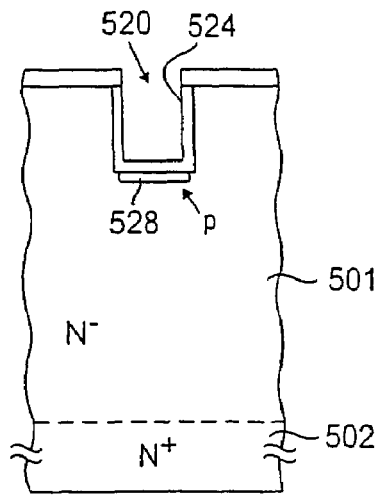
Figure 4C:
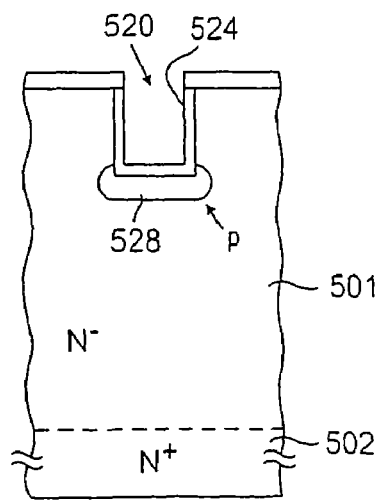

In FIG. 4(b), a layer of silicon dioxide 524 is grown in trench 520. The thickness of the silicon dioxide layer 524 should be sufficient to prevent implanted atoms from penetrating the silicon adjacent to and below the sidewalls of the trench 520, while allowing the implanted atoms to penetrate the oxide layer 524 at the bottom of the trench 520 so that they can be deposited into the silicon adjacent and beneath the trench bottom. Next, a dopant 528 such as boron is implanted through the oxide layer at the bottom of the trench 520. The total dose of dopant and the implant energy should be chosen such that the amount of dopant left in the epitaxial layer 501 after the subsequent diffusion and etching steps are performed satisfies the breakdown requirements of the resulting device. Next, in FIG. 4(c), a high temperature diffusion step is performed to "drive-in" the implanted dopant 528 both vertically and laterally. Oxide layer 524 is removed from the bottom of the trench 520. The oxide layer 524 may or may not be removed from the sidewalls of the trench 520.

Figure 4D:
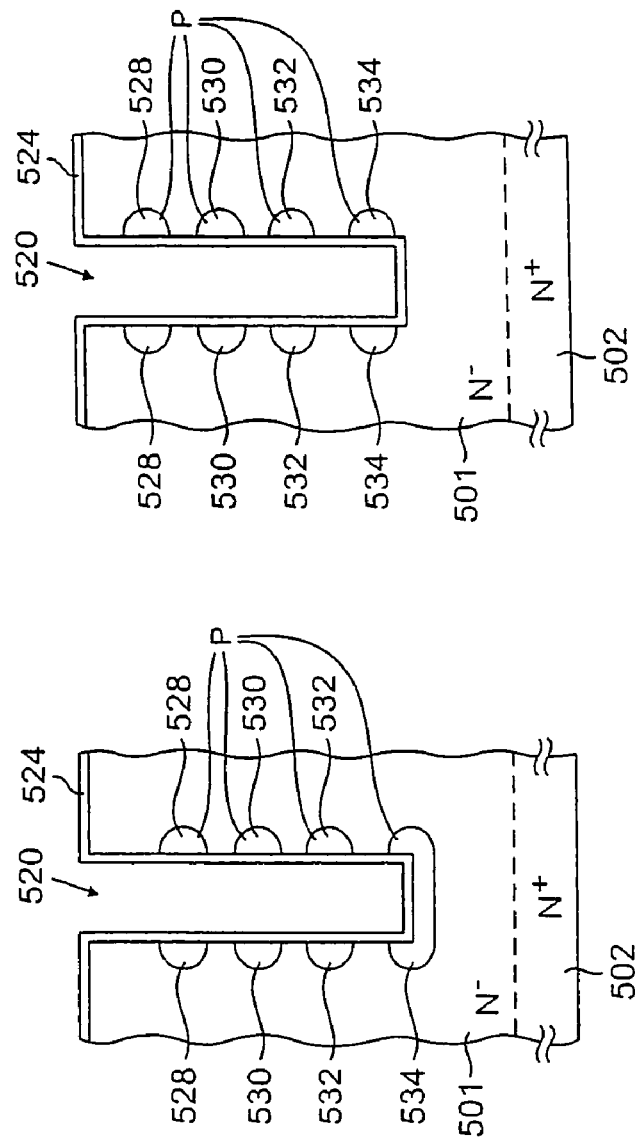
Figure 4E:
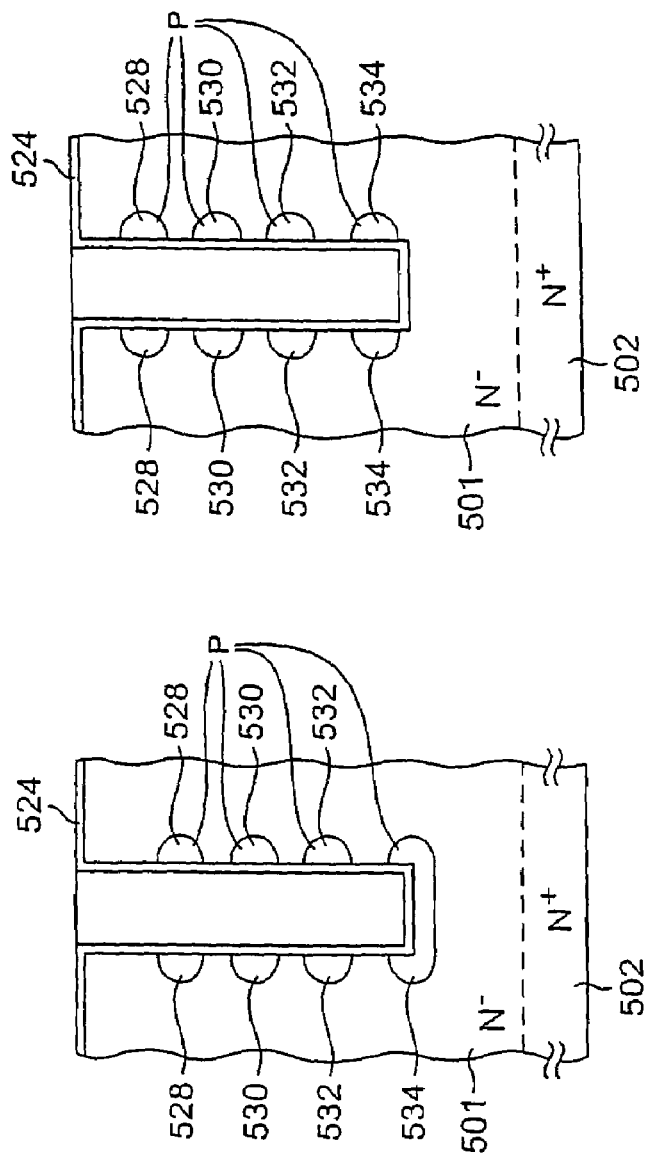

In FIG. 4(d), the depth of the trench 520 is increased by an amount no greater than that which will allow the subsequently formed doped sections to overlap one another after the final diffusion step is performed at the end of the fabrication process. Next, a second doped segment of the column is fabricated by repeating the steps of growing an oxide layer on the trench walls, implanting and diffusing dopant through the bottom of the trench, and removing the oxide layer from the bottom of the trench. This process can be repeated as many times as necessary to form the appropriate number of doped segments to provide the desired breakdown voltage. For example, in FIG. 4(d), four such doped segments 528, 530, 532, and 534 are shown. As seen in FIG. 4d(i), the trench etching process is complete prior to the formation of the final doped segment 534. Alternatively, as seen in FIG. 4d(ii), after the final doped segment 534 is formed, the trench may undergo another etch step to etch through the final doped segment 534, ensuring that the proper total charge dosage and overlap of the doped segments is achieved.

Finally, the trench 520 is filled with a material that does not adversely affect the characteristics of the device. Exemplary materials include, but are not limited to, thermally grown silicon dioxide, a deposited dielectric such as silicon dioxide, silicon nitride, or a combination of thermally grown and deposited layers of these or other materials, high resistivity single crystal silicon, high resistivity polysilicon, or a sandwich of thermal oxide, a deposited dielectric and high resistivity polysilicon. The trench may also be filled with sedimented glass, either by itself in combination with any one or more of the aforementioned materials. If high resistivity polysilicon is employed, it may be converted to single crystal silicon using a recrystallization procedure such as a high temperature anneal step.

Figure 4F:
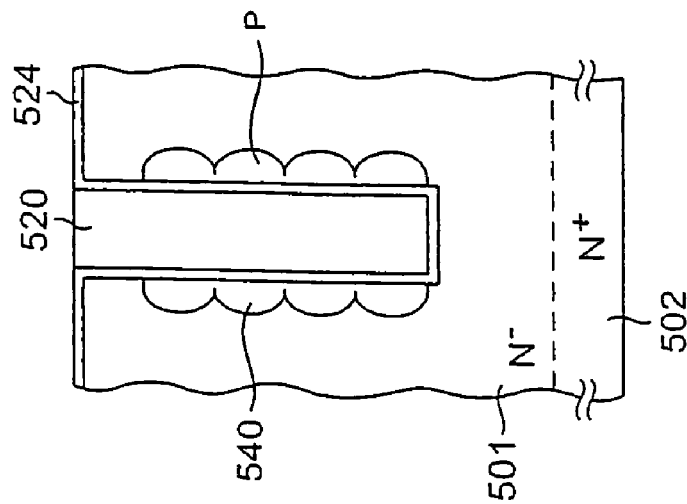
Figure 4F:
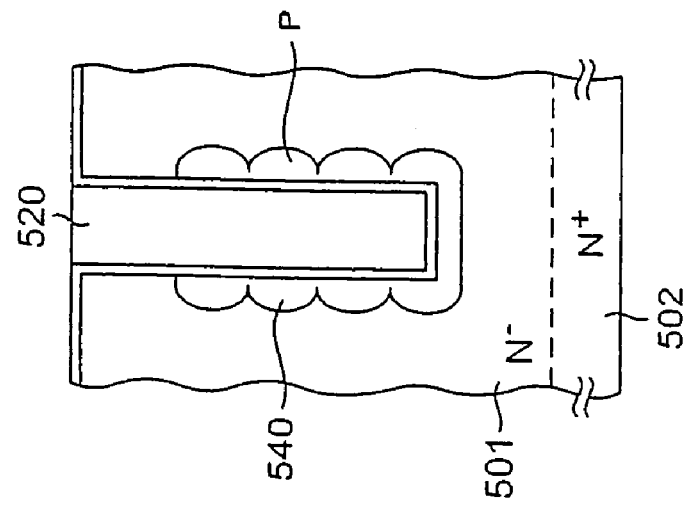

Finally, as shown in FIGS. 4f(i) and 4f(ii), after planarizing the surface of the structure, the structure undergoes a high temperature diffusion step to cause the doped segments to overlap so that a continuous doped column 540 is formed.

The aforementioned sequence of processing steps resulting in the structures depicted in FIG. 4f(i) and 4f(ii) provides a voltage sustaining layer with p-type doped columns on which any of a number of different power semiconductor devices can be fabricated. As previously mentioned, such power semiconductor devices include vertical DMOS, V-groove DMOS, and trench DMOS MOSFETs, IGBTs and other MOS-gated devices. For instance, FIG. 3 shows an example of a MOSFET that includes a voltage sustaining layer with doped columns constructed in accordance with the principles of the present invention. It should be noted that while FIG. 4 shows a single trench that is used to form the doped column, the present invention encompasses a voltage sustaining regions having single or multiple trenches to form any number of doped columns. For example, a doped column or columns may be located below the center of the gate or in other locations when appropriate to decrease the on-resistance of the device.

Once the voltage sustaining region and the doped column or columns have been formed as shown in FIG. 4, the MOSFET shown in FIG. 3 can be completed in the following manner. The gate oxide is grown after an active region mask is formed. Next, a layer of polycrystalline silicon is deposited, doped, and oxidized. The polysilcon layer is then masked to form the gate regions. The p+ doped deep body regions 5b and 6b are formed using conventional masking, implantation and diffusion steps. For example, the p+-doped deep body regions are boron implanted at 20 to 200 KeV with a dosage from about $1 \times 10^{14}$ to $5 \times 10^{15}/\text{cm}^2$. The shallow body regions 5a and 6a are formed in a similar fashion. The implant dose for this region will be $1 \times 10^{13}$ to $5 \times 10^{14}/\text{cm}^2$ at an energy of 20 to 100 KeV.

Next, a photoresist masking process is used to form a patterned masking layer that defines source regions 7 and 8. Source regions 7 and 8 are then formed by an implantation and diffusion process. For example, the source regions may be implanted with arsenic at 20 to 100 KeV to a concentration that is typically in the range of $2 \times 10^{15}$ to $1.2 \times 10^{16}/\text{cm}^2$. After implantation, the arsenic is diffused to a depth of approximately 0.5 to 2.0 microns. The depth of the body region typically ranges from about 1–3 microns, with the P+ doped deep body region (if present) being slightly deeper. The DMOS transistor is completed in a conventional manner by etching the oxide layer to form contact openings on the front surface. A metallization layer is also deposited and masked to define the source-body and gate electrodes. Also, a pad mask is used to define pad contacts. Finally, a drain contact layer is formed on the bottom surface of the substrate.

It should be noted that while a specific process sequence for fabricating the power MOSFET is disclosed, other process sequences may be used while remaining within the scope of this invention. For instance, the deep p+ doped body region may be formed before the gate region is defined. It is also possible to form the deep p+ doped body region prior to forming the trenches. In some DMOS structures, the P+ doped deep body region may be shallower than the P-doped body region, or in some cases, there may not even be a P+ doped body region.

Although various embodiments are specifically illustrated and described herein, it will be appreciated that modifications and variations of the present invention are covered by the above teachings and are within the purview of the appended claims without departing from the spirit and intended scope of the invention. For example, a power semiconductor device in accordance with the present invention may be provided in which the conductivities of the various semiconductor regions are reversed from those described herein. Moreover, while a vertical DMOS transistor has been used to illustrate exemplary steps required to fabricate a device in accordance with the present invention, other DMOS FETs and other power semiconductor devices such as diodes, bipolar transistors, power JFETs, IGBTs, MCTs, and other MOS-gated power devices may also be fabricated following these teachings.

What is claimed is:

1. A power semiconductor device comprising:
   a substrate of a first or second conductivity type;
   a voltage sustaining region disposed on said substrate, said voltage sustaining region including:
      an epitaxial layer having a first conductivity type;
      at least one trench located in said epitaxial layer;
      at least one doped column having a dopant of a second conductivity type, said column being formed from a plurality of doped layers diffused into one another, said doped layers being located in said epitaxial layer adjacent a sidewall of said trench and arranged vertically one over the other;
      a filler material substantially filling said trench; and
      at least one region disposed over said voltage sustaining region to define a junction therebetween.

2. The device of claim 1 wherein said at least one region further includes:

a gate dielectric and a gate conductor disposed above said gate dielectric;

first and second body regions located in the epitaxial layer to define a drift region therebetween, said first and second body regions having said second conductivity type; and first and second source regions of the first conductivity type located in the first and second body regions, respectively.

3. The device of claim 1 wherein said material filling the trench is high resistivity polysilicon.

4. The device of claim 2 wherein said first and second body regions include deep body regions.

5. The device of claim 1 wherein said material filling the trench is a dielectric material.

6. The device of claim 5 wherein said dielectric material is silicon dioxide.

7. The device of claim 5 wherein said dielectric material is silicon nitride.

8. The device of claim 1 wherein said dopant is boron.

9. The device of claim 1 wherein said trench has a circular cross-section, wherein said circular cross-section is parallel to a horizontal surface of the semiconductor device.

10. The device or claim 1 wherein said trench has a cross-sectional shape selected from the group consisting of a square, a rectangle, an octagon and a hexagon, wherein said cross-section shape is parallel to a horizontal surface of the semiconductor device.

11. A power semiconductor device made in accordance with a method comprising the steps of:
  A. providing a substrate of a first or second conductivity type;
  B. forming a voltage sustaining region on said substrate by:
    1. depositing an epitaxial layer on the substrate, said epitaxial layer having a first conductivity type;
    2. forming at least one trench in said epitaxial layer, said at least one trench having walls and a bottom;
    3. depositing a barrier material along the walls of said trench;
    4. implanting a dopant of a second conductivity type through the barrier material into a portion of the epitaxial layer adjacent to and beneath the bottom of said trench;
    5. diffusing said dopant to form a first doped layer in said epitaxial layer;
    6. removing the barrier material from at least the bottom of the trench;
    7. etching the trench through said first doped layer and repeating steps (B.3)–(B.6) to form a second doped layer vertically below said first doped layer;
    8. depositing a filler material in said trench to substantially fill said trench;
    9. diffusing said dopant in the first and second doped layers to cause the first and second doped layers to overlap one another; and
  C. forming over said voltage sustaining region at least one region of said second conductivity type to define a junction therebetween.

12. A power semiconductor device made in accordance with a method comprising the steps of:
  A. providing a substrate of a first or second conductivity type;
  B. forming a voltage sustaining region on said substrate by:
    1. depositing an epitaxial layer on the substrate, said epitaxial layer having a first conductivity type;
    2. forming at least one trench iii said epitaxial layer, said at least one trench having wails and a bottom;
    3. depositing a harrier material along the wails or said trench;
    4. implanting a dopant of a second conductivity type through the barrier material into a portion of the epitaxial layer adjacent to and beneath the bottom of said trench;
    5. diffusing said dopant to form a first doped layer in said epitaxial layer;
    6. removing the barrier material from at least the bottom of the trench;
    7. etching the trench through said first doped layer and repeating steps (B.3)–(B.6) to form a second doped layer vertically below said First doped layer;
    8. depositing a filler material in said trench to substantially fill said trench;
    9. diffusing said dopant in the first and second doped layers to cause the first and second doped layers to overlap one another; and
  C. forming over said voltage sustaining region at least one region of said second conductivity type to define a junction therebetween,
    wherein said material filling the trench is high resistivity polysilicon.

13. A power semiconductor device made in accordance with a method comprising the steps of:
  A. providing a substrate of a first or second conductivity type;
  B. forming a voltage sustaining region on said substrate by:
    1. depositing an epitaxial layer on the substrate, said epitaxial layer having a first conductivity type;
    2. forming at least one trench in said epitaxial layer, said at least one trench having walls and a bottom;
    3. depositing a barrier material along the walls of said trench;
    4. implanting a dopant of a second conductivity type through the barrier material into a portion of the epitaxial layer adjacent to and beneath the bottom of said trench;
    5. diffusing said dopant to from a first doped layer in said epitaxial layer;
    6. removing the barrier material from at least the bottom of the trench;
    7. etching the trench through said first doped layer and repeating steps (B.3)–(B.6) to form a second doped layer vertically below said first doped layer;
    8. depositing a filler material in said trench to substantially fill said trench;
    9. diffusing said dopant in the first and second doped layers to cause the first and second doped layers to overlap one another; and
  C. forming over said voltage sustaining region at least one region or said second conductivity type to define a junction therebetween,
    wherein said power semiconductor device is selected from the group consisting of a vertical Double-diffused Metal Oxide Semiconductor (DMOS), a V-groove Double-diffused Metal Oxide Semiconductor (DMOS), and a trench Double-diffused Metal Oxide Semiconductor (DMOS), Metal Oxide Semiconductor Field-Effect Transistor (MOSFET), an Insulated Gate Bipolar Transistor (IGBT), and a bipolar transistor.

* * * * *

UNITED STATES PATENT AND TRADEMARK OFFICE
CERTIFICATE OF CORRECTION

PATENT NO. : 7,091,552 B2  Page 1 of 1
APPLICATION NO. : 10/724849
DATED : August 15, 2006
INVENTOR(S) : Richard A. Blanchard It is certified that error appears in the above-identified patent and that said Letters Patent is hereby corrected as shown below:

Specification, Col. 1, Line 49, after "18", insert -- , -- .
Specification, Col. 1, Line 49, after "polysilicon", insert -- , -- .
Specification, Col. 2, Line 44, after "substrate", insert -- , -- .
Specification, Col. 2, Line 45, after "region", insert -- , -- .
Specification, Col. 4, Line 25, after "cause", insert -- the -- .
Specification, Col. 4, Line 25, after "doped", change "section" to -- sections -- .
Claim 10, Col. 7, line 24, after "device", change "or" to -- of -- .
Claim 10, Col. 7, Line 27, after "said", change "cross-section" to -- cross-sectional -- .
Claim 12, Col. 8, line 1, after "trench", change "iii" to -- in -- .
Claim 12, Col. 8, line 2, after "having", change "wails" to -- walls-- .
Claim 12, Col. 8, line 3, before "material", change "harrier" to -- barrier-- .
Claim 12, Col. 8, line 3, after "the", change "wails" to -- walls-- .
Claim 12, Col. 8, line 3, before "said", change "or" to -- of-- .
Claim 12, Col. 8, line 15, before "doped", change "First" to -- first -- .
Claim 13, Col. 8, line 42, after "to", change "from" to -- form-- .
Claim 13, Col. 8, line 55, after "region", change "or" to -- of -- .

Signed and Sealed this

Eighteenth Day of December, 2007

JON W. DUDAS
*Director of the United States Patent and Trademark Office*